(12) United States Patent
Li et al.

(10) Patent No.: US 12,345,880 B2
(45) Date of Patent: Jul. 1, 2025

(54) WEARABLE DISPLAY DEVICE AND METHOD FOR DETERMINING GAZE POSITION

(71) Applicant: BOE Technology Group Co., Ltd., Beijing (CN)

(72) Inventors: Yapeng Li, Beijing (CN); Xuan Feng, Beijing (CN); Lei Wang, Beijing (CN); Ping Zhang, Beijing (CN); Wenhao Tian, Beijing (CN); Yangbing Li, Beijing (CN); Chengfu Xu, Beijing (CN); Yuanyuan Ma, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/781,511

(22) PCT Filed: May 27, 2021

(86) PCT No.: PCT/CN2021/096412
§ 371 (c)(1),
(2) Date: Apr. 24, 2024

(87) PCT Pub. No.: WO2022/246742
PCT Pub. Date: Dec. 1, 2022

(65) Prior Publication Data
US 2024/0280807 A1    Aug. 22, 2024

(51) Int. Cl.
*G02B 27/00* (2006.01)
*F21V 8/00* (2006.01)
(Continued)

(52) U.S. Cl.
CPC ....... *G02B 27/0093* (2013.01); *G02B 6/0073* (2013.01); *G02B 27/0172* (2013.01);
(Continued)

(58) Field of Classification Search
CPC .............. G02B 27/0093; G02B 6/0073; G02B 27/0172; G02B 27/0955;
(Continued)

(56) References Cited

U.S. PATENT DOCUMENTS 12,174,381 B2 * 12/2024 Yamada ............. G02B 27/0179
2015/0277171 A1 * 10/2015 Hwang ............... G02F 1/13318
349/138
(Continued)

FOREIGN PATENT DOCUMENTS

| CN | 104919364 A | 9/2015 |
| CN | 107223276 A | 9/2017 |
| CN | 110850628 A | 2/2020 |

*Primary Examiner* — Dmitriy Bolotin
(74) *Attorney, Agent, or Firm* — IPro, PLLC

(57) ABSTRACT

Provided is a wearable display device. The wearable display device includes: a display panel, comprising a display region and a peripheral region surrounding the display region; a first light-emitting element, configured to emit light to be irradiated to eyes of a user; a plurality of photoelectric sensor assemblies in the peripheral region; a first polarizer layer, disposed on a light-emitting side of the first light-emitting element; and a second polarizer layer, disposed on a side, distal from the display panel, of the photoelectric sensor assembly, a polarization direction of the second polarizer layer being intersected with a polarization direction of the first polarizer layer.

20 Claims, 7 Drawing Sheets

(51) Int. Cl.
  *G02B 27/01* (2006.01)
  *G02B 27/09* (2006.01)
  *G02F 1/13357* (2006.01)
  *G02F 1/1368* (2006.01)
  *G06F 3/01* (2006.01)
  *H10K 59/121* (2023.01)

(52) U.S. Cl.
  CPC ... *G02B 27/0955* (2013.01); *G02F 1/133615* (2013.01); *G02F 1/13362* (2013.01); *G02F 1/1368* (2013.01); *G06F 3/013* (2013.01); *H10K 59/1213* (2023.02); *G02B 2027/0118* (2013.01)

(58) Field of Classification Search
  CPC ....... G02B 2027/0118; G02F 1/133615; G02F 1/13362; G02F 1/1368; G06F 3/013; G06F 3/01; H10K 59/1213
  See application file for complete search history.

(56) References Cited

U.S. PATENT DOCUMENTS

| | | |
|---|---|---|
| 2016/0026039 A1 | 1/2016 | Sakai et al. |
| 2019/0250707 A1 | 8/2019 | Kondo et al. |
| 2020/0110271 A1* | 4/2020 | Komogortsev ...... G02B 27/017 |
| 2022/0413296 A1* | 12/2022 | Toride .................. G09G 3/003 |
| 2025/0017057 A1* | 1/2025 | Choi ..................... H10K 59/65 |

* cited by examiner

WEARABLE DISPLAY DEVICE AND METHOD FOR DETERMINING GAZE POSITION

CROSS-REFERENCE TO RELATED APPLICATION

The present disclosure is a US national stage of international application No. PCT/CN2021/096412, filed on May 27, 2021, the content of which is incorporated herein by reference in its entirety.

TECHNICAL FIELD

The present disclosure relates to the field of virtual reality technologies, and in particular, relates to a wearable display device and a method for determining a gaze position.

BACKGROUND

A virtual reality (VR) device refers to a device that can create a virtual environment based on displayed images and exerts an immersive feeling for the user in the virtual environment.

SUMMARY

The present disclosure provides a wearable display device and a method for determining a gaze position. The technical solutions are as follows:

In one aspect, a wearable display device is provided. The wearable display device includes:
- a display panel, including a display region and a peripheral region surrounding the display region;
- a first light-emitting element, configured to emit light to be irradiated to eyes of a user;
- a plurality of photoelectric sensor assemblies, disposed in the peripheral region, each of the photoelectric sensor assemblies is configured to receive an optical signal, reflected via the eyes of the user, of the first light-emitting element, and convert the optical signal into an electric signal, the electric signal being configured to determine a gaze position of the eyes of the user on the display panel;
- a first polarizer layer, disposed on a light-emitting side of the first light-emitting element; and
- a second polarizer layer, disposed on a side, distal from the display panel, of the photoelectric sensor assembly, a polarization direction of the second polarizer layer being intersected with a polarization direction of the first polarizer layer.

Optionally, the polarization direction of the second polarizer layer is perpendicular to the polarization direction of the first polarizer layer.

Optionally, the first light-emitting element is an infrared light-emitting diode.

Optionally, each of the photoelectric sensor assemblies includes a switch transistor and a photodiode electrically connected to the switch transistor; and the display panel includes a plurality of sub-pixels in the display region, each of the sub-pixels including at least one pixel transistor;
wherein the switch transistor and the pixel transistor are prepared by a same preparation process.

Optionally, the display panel is a liquid crystal display panel; and the display panel includes an array substrate, a color film substrate, and a liquid crystal layer between the array substrate and the color film substrate; wherein the array substrate includes a first region and a second region, and an orthographic projection of either the color film substrate or the liquid crystal layer on the array substrate is within the first region;
wherein the pixel transistor is disposed in the first region, the switch transistor is disposed in the second region, and an orthographic projection of the photodiode on the array substrate is within the second region.

Optionally, the first light-emitting element is disposed on a display side of the display panel; and the first polarizer layer is disposed on a side, distal from the display panel, of the first light-emitting element and is configured to convert light emitted by the first light-emitting element into polarized light.

Optionally, the display panel further includes a third polarizer layer and a backlight disposed on a side, distal from the color film substrate, of the array substrate, wherein the backlight includes a second light-emitting element and a light guide plate; wherein the first light-emitting element and the second light-emitting element are both disposed at an end of the light guide plate, and the light guide plate is configured to convert the light emitted by the first light-emitting element and light emitted by the second light-emitting element into a surface light source; and
the third polarizer layer is disposed between the light guide plate and the array substrate and is configured to convert the light emitted by the second light-emitting element into polarized light and to transmit the light emitted by the first light-emitting element; and the first polarizer layer is disposed on a side, distal from the array substrate, of the color film substrate and is configured to convert the light of the first light-emitting element into polarized light and resolve the polarized light of the second light-emitting element after being electrically modulated by the liquid crystal, a polarization direction of the third polarizer layer being intersected with the polarization direction of the first polarizer layer.

Optionally, the display panel is an organic light-emitting diode display panel; and the display panel includes a base substrate, the plurality of sub-pixels being disposed on a side of the base substrate, each of the sub-pixels further including a light-emitting unit; wherein the base substrate includes a third region and a fourth region, an orthographic projection of the light-emitting unit on the base substrate being within the third region;
wherein the pixel transistor is disposed in the third region, the switch transistor is disposed in the fourth region, and an orthographic projection of the photodiode on the base substrate is within the fourth region.

Optionally, the first light-emitting element is disposed on the display side of the display panel; and the first polarizer layer is disposed on the side, distal from the display panel, of the first light-emitting element and is configured to convert the light emitted by the first light-emitting element into polarized light.

Optionally, the wearable display device further includes a cover plate;
wherein the cover plate is disposed on the display side of the display panel, an orthographic projection of the cover plate on the display panel covers the display panel, and the cover plate is made of a transparent material.

Optionally, each of the photoelectric sensor assemblies includes a switch transistor and a photodiode electrically connected to the switch transistor; and the display panel includes a plurality of sub-pixels in the display region, each of the sub-pixels including at least one pixel transistor; wherein the switch transistor is attached to the display panel.

Optionally, the first light-emitting element is disposed on the display side of the display panel; and the first polarizer layer is disposed on the side, distal from the display panel, of the first light-emitting element and is configured to convert the light emitted by the first light-emitting element into polarized light; and the wearable display device further includes a media layer; wherein the media layer is disposed on a side, distal from the photoelectric sensor assembly, of the second polarizer layer, and the media layer is made of a transparent material.

Optionally, the wearable display device further includes: a plurality of filters in one-to-one correspondence to the plurality photoelectric sensor assembly, wherein each of the filters is disposed on a side, distal from the display panel, of the corresponding photoelectric sensor assembly;

wherein the filters are configured to transmit infrared light and absorb visible light.

Optionally, the wearable display device further includes: a lens and a lens frame;

wherein the lens is disposed on the display side of the display panel, and the lens frame is disposed at an edge of the lens.

Optionally, the peripheral region includes: a first region extending along a first direction and a second region extending along a second direction, the first direction being intersected with the second direction; the plurality of photoelectric sensor assemblies include a plurality of first photoelectric sensor assemblies and a plurality of second photoelectric sensor assemblies;

wherein the plurality of first photoelectric sensor assemblies are disposed in the first region and arranged along the first direction, and the plurality of second photoelectric sensor assemblies are disposed in the second region and arranged along the second direction.

In another aspect, a method for determining a gaze position is provided, which is applicable to the wearable display device as defined above. The method includes:

receiving an optical signal, diffusely reflected via eyes of a user, of a first light-emitting element;
converting the optical signal into an electric signal;
determining the gaze position of the eyes of the user on a display panel based on the electric signal.

In another aspect, a computer readable storage medium is provided. The computer readable storage medium stores one or more instructions therein, where the one or more instructions, when loaded and executed by a wearable display device, cause the wearable display device to perform the method as described above.

In another aspect, a computer program product storing one or more instructions therein is provided, wherein the computer program product, when loaded and run on a computer, causes the computer to perform the method as described above.

BRIEF DESCRIPTION OF DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

For clearer descriptions of the objectives, technical solutions, and advantages of the present disclosure, embodiments of the present disclosure are described in detail hereinafter with reference to the accompanying drawings.

In the related art, a VR device includes a display panel, a camera, a processor, and a drive circuit. The camera is configured to capture an eye image of the user. The processor is configured to determine a gaze position of the user on the display panel according to the eye image, and partially render the image to be displayed according to the gaze position. The drive circuit is configured to drive, based on a received partially rendered display image, the display panel display. Because the processor may only partially render the region of a gaze point in the display image and does not need to globally render the to-be-displayed image, not only a load of the processor may be reduced, but also a display effect of the display panel may be ensured.

However, in the related art, the processor has a less efficiency in determining the gaze position according to the eyes image taken by the camera, thereby resulting in a lower display efficiency of the display panel.

The terms used in the detailed description of the present disclosure are merely for interpreting, instead of limiting, the embodiments of the present disclosure. It should be noted that unless otherwise defined, technical or scientific terms used in the embodiments of the present disclosure shall have ordinary meanings understandable by persons of ordinary skill in the art to which the disclosure belongs. The terms "first," "second," and the like used in the embodiments of the present disclosure are not intended to indicate any order, quantity or importance, but are merely used to distinguish the different components. The terms "comprise," "include," and derivatives or variations thereof are used to indicate that the element or object preceding the terms covers the element or object following the terms and its equivalents, and shall not be understood as excluding other elements or objects. The terms "connect," "contact," and the like are not intended to be limited to physical or mechanical connections, but may include electrical connections, either direct or indirect connection. The terms "on," "under," "left," and "right" are only used to indicate the relative positional relationship. When the absolute position of the described object changes, the relative positional relationship may change accordingly.

Figure 1:
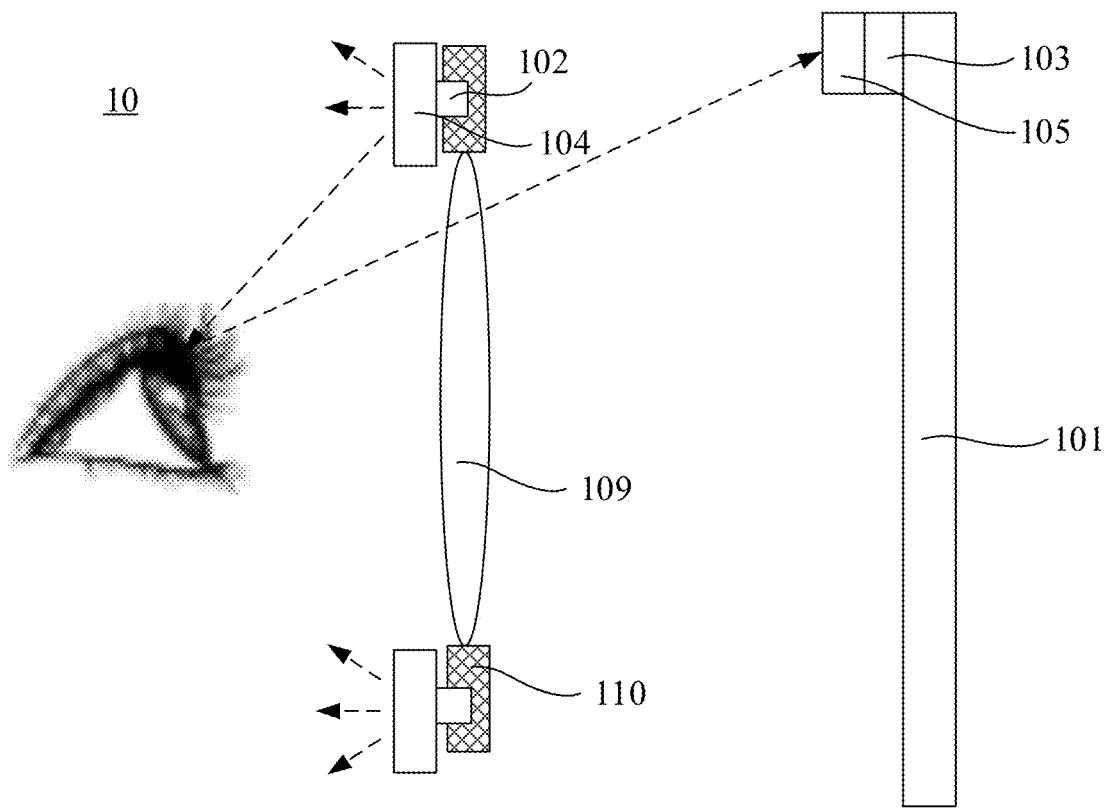
FIG. 1 is a schematic structural view of a wearable display device according to an embodiment of the present disclosure.

FIG. 1 is a schematic structural view of a wearable display device according to an embodiment of the present disclosure. As illustrated in FIG. 1, a wearable display device 10 may include a display panel 101, a first light-emitting element 102, a plurality of photoelectric sensor assemblies 103, a first polarizer layer 104, and a second polarizer layer 105. FIG. 1 shows one photoelectric sensor assembly 103.

Light emitted by the first light-emitting element 102 is configured to irradiate eyes of a user, and the eyes of the user can reflect the light emitted by the first light-emitting element 102. Thus, each of the photoelectric sensor assemblies 103 is configured to receive optical signals, reflected via the eyes of the user, of the first light-emitting element 102, and convert the optical signals into electric signals configured to determine a gaze position of the eyes of the user on the display panel 101. The first polarizer layer 104 is disposed on a light-emitting side of the first light-emitting element 102, and the second polarizer layer 105 is disposed on a side, distal from the display panel 101, of the photoelectric sensor assembly 103. A polarization direction of the second polarizer layer 105 is intersected with a polarization direction of the first polarizer layer 104.

In general, the amount of data of the electric signals is small, and the amount of data of the images is large. Therefore, the processing efficiency of the wearable display device for electric signals is higher than that for images. In the embodiments of the present disclosure, the wearable display device has a high processing efficiency for the electric signal transmitted by each of the photoelectric sensor assemblies 103, such that the gaze position of the eyes of the user on display panel 101 is quickly determined. In this way, the efficiency of displaying images by the display panel 101 is improved, and thus a higher refresh rate of the display panel is achieved.

Figure 2:
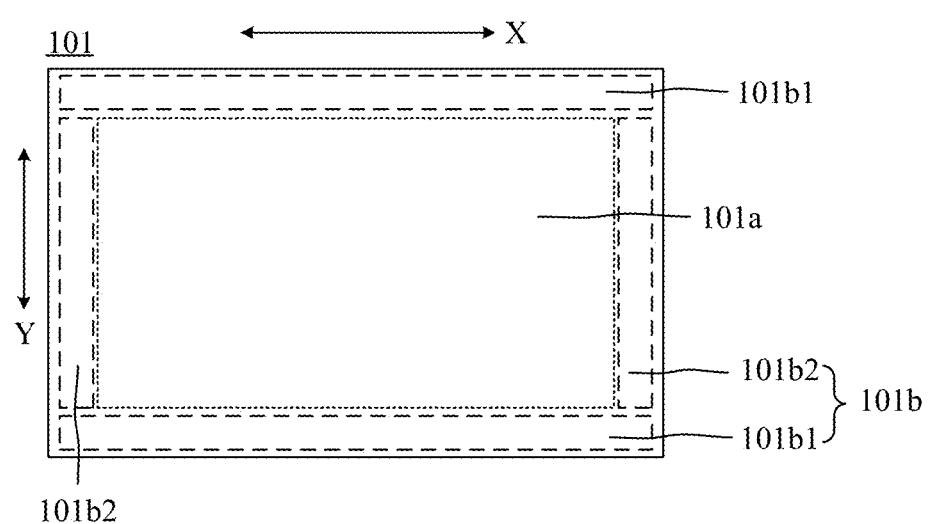
FIG. 2 is a top view of a display panel according to an embodiment of the present disclosure.

FIG. 2 is a top view of a display panel according to an embodiment of the present disclosure. As illustrated in FIG. 2, the display panel 101 may include a display region 101a and a peripheral region 101b surrounding the display area 101a. The plurality of the photoelectric sensor assemblies 103a are disposed in the peripheral region 101b, which cannot affect the normal display of the display panel 101, and the display effect of display panel 101 is better.

In the embodiments of the present disclosure, the light emitted by the first light-emitting element 102 may first pass through the first polarizer layer 104 and then be irradiated to the eyes of the user. Moreover, light reflected via the eyes of the user may first pass through the second polarizer layer 105 and then be transmitted to photoelectric sensor assemblies 103.

The light emitted by the first light-emitting element 102 is converted to polarized light after passing through the first polarizer layer 104. The polarized light is irradiated to the eyes of the user, and specular and diffuse reflections occur at the eyes of the user. The light specularly reflected and diffusely reflected via the eyes of the user may be transmitted to the second polarizer layer 105.

Because the specularly reflected light is the polarized light which is reflected and then emitted along a parallel direction, and the polarization direction of the second polarizer layer 105 is intersected with the polarization direction of the first polarizer layer 104, the light specularly reflected via the eyes of the user may not be transmitted through the second polarizer layer 105. Because the diffusely reflected light is the polarized light which is reflected and then emitted along each direction, the light diffusely reflected via the eyes of the user may be transmitted through the second polarizer layer 105 even in the case that the polarization direction of the second polarizer layer 105 is intersected with the polarization direction of the first polarizer layer 104.

Accordingly, the photoelectric sensor assemblies 103 may not receive the light which is specularly reflected via the eyes of the user, but may only receive the light which is diffusely reflected via the eyes of the user. That is, in the embodiments of the present disclosure, the optical signals of the first light-emitting element 102 reflected via the eyes of the user are the optical signals, diffusely reflected via the eyes of the user, of the first light-emitting element 102.

The photoelectric sensor assembly 103 converts the diffusely reflected optical signal of the first light-emitting element 102 into an electric signal and determines the gaze position of the eyes of the user on the display panel 101 based on the electric signal in the wearable display device. Because the solutions according to the embodiments of the present disclosure suppress specular reflection by the eyes of the user of the light emitted by the first light-emitting element 102, it is possible to avoid the effect of the specularly reflected light on determining the gaze position, thereby ensuring the accuracy of the determined gaze position.

In summary, the embodiments of the present disclosure provide a wearable display device. Because the wearable display device has a high efficiency in processing the electric signal transmitted by each of the photoelectric sensor assemblies, the wearable display device may quickly determine the gaze position of the eyes of the user on the display panel based on an electric signal transmitted by each of photoelectric sensor assemblies. In this way, the efficiency of displaying images by the display panel is improved, and thus a higher refresh rate of the display panel is achieved.

Moreover, because the solutions according to the embodiments of the present disclosure suppress specular reflection by the eyes of the user of the light emitted by the first light-emitting element, it is possible to avoid the effect of the specularly reflected light on determining the gaze position, thereby ensuring the accuracy of the determined gaze position.

In the embodiments of the present disclosure, the wearable display device 10 may also include a processor (not illustrated). The processor may be connected with each of the photoelectric sensor assemblies 103. The position of each of the photoelectric sensor assemblies 103 may be pre-stored in the processor. The processor may be used to determine the gaze position of the eyes of the user on the display panel 101 based on the signal values of the electric signal transmitted by each of the photoelectric sensor assemblies 103 and the position of at least one photoelectric sensor assembly 103.

Optionally, the polarization direction of the second polarizer layer 105 is perpendicular to the polarization direction of the first polarizer layer 104. Configuring the polarization direction of the second polarizer layer 105 to be perpendicular to the polarization direction of the first polarizer layer 104 may further ensure that light of the first light-emitting element 102 specularly reflected via the eyes of the user may not be transmitted through the second polarizer layer 105, thereby preventing the determination of the gaze position from being effected by the specularly reflected light received by photoelectric sensor assemblies 103.

Optionally, the first light-emitting element 102 may be an infrared light-emitting diode. Because reflectivities of the pupil, sclera, and iris of the eyes of the user against the infrared light, are greatly different, by designing the first light-emitting element 102 as an infrared light-emitting diode, the optical signals, reflected via pupil, sclera, and iris, of infrared light received by the photoelectric sensor assemblies 103 which are reflected via pupil, sclera, and iris are greatly different. In this way, it is convenient for the processor to determine the gaze position of the eyes of the user (the pupil) on the display panel 101. Illustratively, the wavelength ranges of the light emitted by the light-emitting element may be 850 nm (nanometer) to 940 nm.

As illustrated in FIG. 2, the peripheral region 101b of the display panel 101 includes a first region 1011a extending along a first direction X and a second region 1011b extending along a second direction Y. The first direction X is intersected with the second direction Y.

Figure 3:
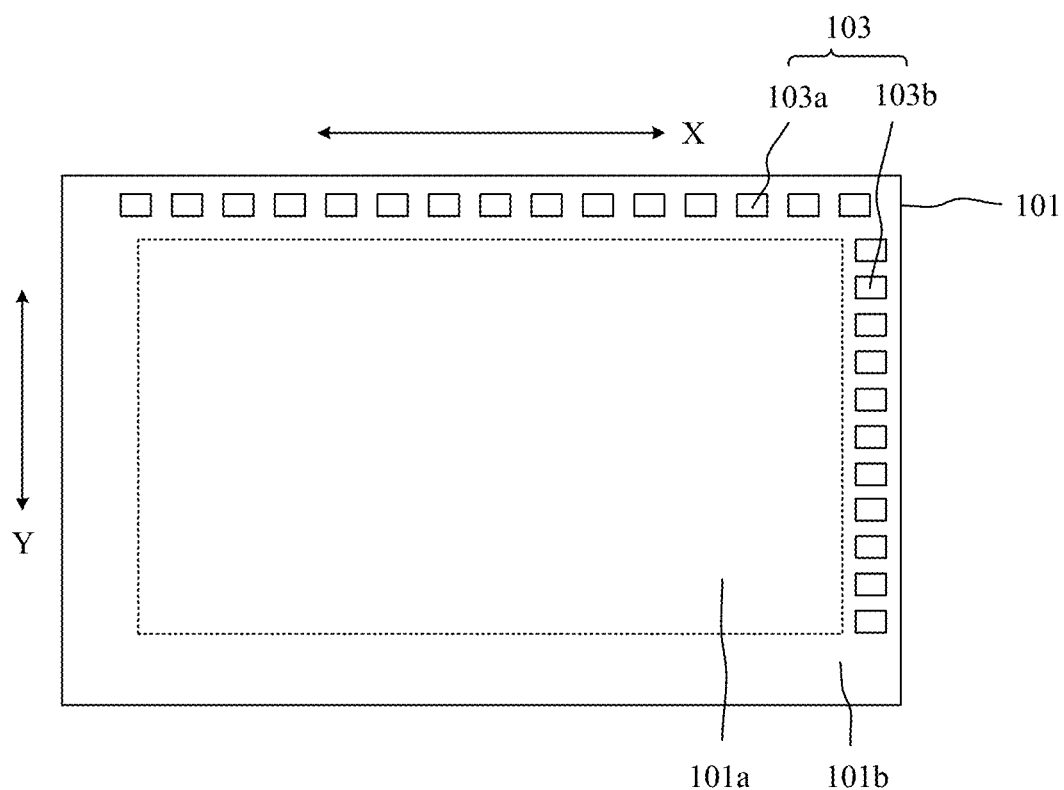
FIG. 3 is a schematic view of a display panel and photoelectric sensor assemblies according to an embodiment of the present disclosure.

As illustrated in FIGS. 2 and 3, the plurality of photoelectric sensor assemblies 103 may include a plurality of first photoelectric sensor assemblies 103a and a plurality of second photoelectric sensor assemblies 103b. The plurality of first photoelectric sensor assemblies 103a are disposed in the first region 1011a and arranged along the first direction X. The plurality of second photoelectric sensor assemblies 104b are disposed in the second region 1011b and arranged along the second direction Y.

Optionally, the plurality of first photoelectric sensor assemblies 103a are arranged evenly along the first direction X, and the plurality of second photoelectric sensor assemblies 103b are arranged evenly along the second direction Y.

In the embodiments of the present disclosure, the processor included in the wearable display device 10 may receive the electric signal transmitted by each of the plurality of first photoelectric sensor assemblies 103a and may determine at least one target first photoelectric sensor assembly from the plurality of first photoelectric sensor assemblies 103a. The processor may also receive the electric signal transmitted by each of the plurality of second photoelectric sensor assemblies 103b and may determine at least one target second photoelectric sensor assembly from the plurality of second photoelectric sensor assemblies 103b. Finally, the processor may determine the gaze position of the eyes of the user on the display panel 101 based on the position of the at least one target first photoelectric sensor assembly and the position of the at least one target second photoelectric sensor assembly.

The signal value of the electric signal transmitted by the target first photoelectric sensor assembly may be less than or equal to the first threshold, and the signal value of the electric signal transmitted by the target second photoelectric sensor assembly may be less than or equal to the second threshold. The first threshold and the second threshold may be equal, or not, and the present disclosure is not limited in this respect.

The eyes of the user include the pupil, sclera, and iris. The gaze position of the eyes of the user on the display panel 101 is the gaze position of the pupil on the display panel 101. Due to the deepest color of the pupil, the signal value of the optical signal reflected via the pupil is minimal. Further, the signal value of the electric signal converted from the optical signal reflected via the pupil is minimal. The signal value of an optical signal is used to indicate the intensity of the light.

Accordingly, based on the signal value of the electric signal transmitted by the target first photoelectric sensor assembly which is less than or equal to the first threshold, and the signal value of the electric signal transmitted by the target second photoelectric sensor assembly which is less than or equal to the second threshold, the gaze position of the pupil of the eyes of the user on the display panel 101 may be determined.

Optionally, the first threshold and the second threshold may be pre-stored fixed values in the processor. Alternatively, the first threshold may be determined by the processor based on the received signal values of the electric signals of the plurality of first photoelectric sensor assemblies 103a; the second threshold may be determined by the processor from the received signal values of the electric signals of the plurality of second photoelectric sensor assemblies 103b.

Illustratively, the processor may sort the signal values of the N electric signals transmitted by the N first photoelectric sensor assemblies 103a in an ascending order, and determine the signal value in the $n^t$ position as the first threshold. N is an integer greater than 1 and n is an integer greater than 1 and less than N/2. The processor may sort the signal values of the M electric signals transmitted by the M second photoelectric sensor assemblies 103b in an ascending order, and determine the signal value in the $m^{th}$ position as the second threshold. M is an integer greater than 1 and n is an integer greater than 1 and less than M/2.

Optionally, the processor determines the minimum of the signal value of the received electric signals of the plurality of first photoelectric sensor assemblies 103a as the first threshold, and the minimum of the signal value of the received electric signals of the plurality of second photoelectric sensor assemblies 103b as the second threshold.

In the embodiments of the present disclosure, the processor may determine a first coordinate of the target first photoelectric sensor assembly with the minimal signal value of the electric signal transmitted by the plurality of first photoelectric sensor assemblies 103a, and may determine a second coordinate of the target second photoelectric sensor assembly with the minimal signal value of the electric signal transmitted by the plurality of second photoelectric sensor assemblies 103b. The processor may determine the gaze position of the eyes of the user on the display panel 101 based on the first coordinate and the second coordinate.

As illustrated in FIG. 2, the first direction X is perpendicular to the second direction Y. The first direction X may be the pixel row direction of the display panel 101, and the second direction Y may be the pixel column direction of the display panel 101.

Figure 4:
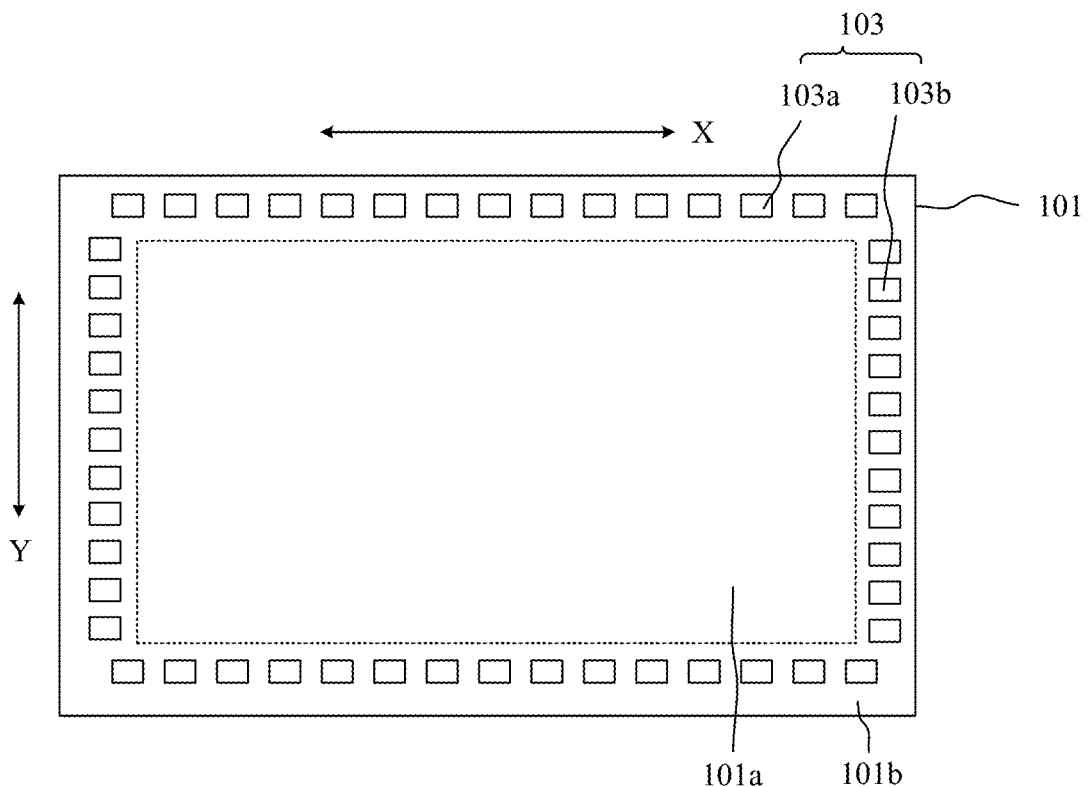
FIG. 4 is view of another display panel and photoelectric sensor assemblies according to an embodiment of the present disclosure.

As illustrated in FIG. 2, the peripheral region 101b may include two first regions 1011a and two second regions 1011b. The two first regions 1011a may be arranged along the second direction Y and respectively disposed on either side of the display region 101a. The two second regions 1011b may be arranged along the first direction X and respectively disposed on either side of the display region 101*a*. As illustrated in FIG. 4, in the plurality of first photoelectric sensor assemblies 103*a* of the plurality of the photoelectric sensor assemblies 103, one portion of the first photoelectric sensor assemblies 103*a* are disposed in one of the first regions 1011*a*, and the other portion of the first photoelectric sensor assemblies 104*a* are disposed in the other of the first regions 1011*a*. In the plurality of second photoelectric sensor assemblies 103*b* of the plurality of the photoelectric sensor assemblies 103, one portion of the second photoelectric sensor assemblies 103*b* are disposed in one of the second regions 1011*b*, and the other portion of the second photoelectric sensor assemblies 103*b* are disposed in the other of the second regions 1011*b*.

Thus, the processor may determine the gaze position of the eyes of the user on the display panel 101 based on the first photoelectric sensor assemblies 103*a* in the two first regions 1011*a* and the second photoelectric sensor assemblies 103*b* in the two second regions 1011*b*, improving the accuracy of the determined gaze position.

In the embodiments of the present disclosure, the wearable display device 10 may also include a processor and a controller (not illustrated). Each of the photoelectric sensor assemblies 103 may include a switch transistor and a photodiode electrically connected to the switch transistor. The display panel 101 includes a plurality of subpixels in the display area 101*a*, each subpixel including at least one pixel transistor.

The switch transistor includes a gate electrode, a first electrode, and a second electrode. The first electrode of the switch transistor is electrically connected to the photodiode; the second electrode of the switch transistor is electrically connected to the processor. The control electrode of the switch transistor is electrically connected to the controller, where the controller is configured to control the turning on and the turning off of the switch transistor. One of the first and second electrode is a source, and the other is a drain.

The photodiode may convert an optical signal into an electric signal upon receiving the optical signal diffusely reflected via the eyes of the user. The controller controls the switch transistor to turn on, and the electric signal is transmitted to the processor by the switch transistor for the processor to determine the gaze position based on the electric signal.

In some embodiments, the switch transistors in photoelectric sensor assembly 103 may be prepared by the same preparation process as the pixel transistors. That is, the switch transistors in photoelectric sensor assembly 103 may be integrated in the display panel 101.

Figure 5:
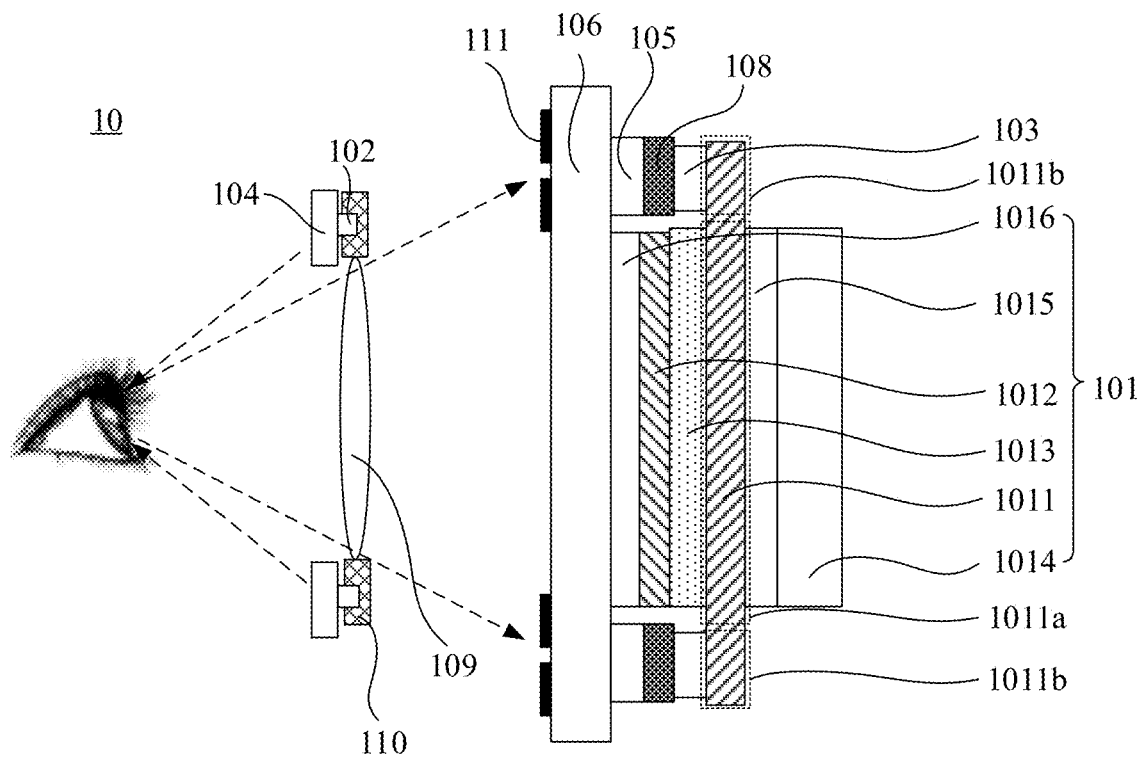
FIG. 5 is a schematic structural view of another wearable display device according to an embodiment of the present disclosure.

Optionally, the display panel 101 is a liquid crystal display panel 101. As illustrated in FIG. 5, the display panel 101 includes an array substrate 1011, a color film substrate 1012, and a liquid crystal layer 1013 between the array substrate 1011 and the color film substrate 1012. The array substrate 1011 includes a first region 101*a* and a second region 1011*b*, wherein an orthographic projection of either the color film substrate 1012 or the liquid crystal layer 1013 on the array substrate 1011 is within the first region 1011*a*. The pixel transistor is in the first region 1011*a*, the switch transistor is disposed in the second region 1011*b*, and an orthographic projection of the photodiode on the array substrate 1011 is within the second region 1011*b*.

The first region 1011*a* of the array substrate 1011, and the color film substrate 1012 and the liquid crystal layer 1013 in the first region 1011*a* of the array substrate 1011 may constitute the display region 101*a* of the display panel 101. The pixel transistor of the first region 1011*a* of the array substrate 1011 may be a transistor for driving a sub-pixel to emit light. Accordingly, the second region 1011*b* of the array substrate 1011 may constitute the peripheral region 101*b* of the display panel 101. The pixel transistors of the first region 1011*a* of the array substrate 1011 and the switch transistors of the second region 1011*b* are both prepared by a process of preparing the array substrate 1011.

As illustrated in FIG. 5, the first light-emitting element 102 may be disposed on a display side of the display panel 101, and the first polarizer layer 104 is disposed on a side, distal from the display panel 101, of the first light-emitting element 102. That is, when the user wears the wearable display device 10, the first light-emitting element 102 may be disposed between the display panel 101 and the user, and the first polarizer layer 104 is disposed between the first light-emitting element 102 and the user.

As illustrated in FIG. 5, the display panel 101 also includes a backlight 1014, a third polarizer layer 1015, and a fourth polarizer layer 1016. The backlight 1014 is disposed on a side, distal from the color film substrate 1012, of the base substrate 1011, for providing a backlight. The third polarizer layer 1015 is disposed between the backlight 1014 and the base substrate 1011, for converting light emitted by the backlight 1014 into polarized light. The fourth polarizer layer 1016 is disposed on a side, distal from the array substrate 1011, of the color film substrate, for resolving the polarized light after electrically modulated by the liquid crystal and producing a bright-dark contrast, thereby enabling the display panel to display the image.

Optionally, in the solution illustrated in FIG. 5, either the third polarizer layer 1015 or the fourth polarizer layer 1016 is a general polarizer in a liquid crystal display panel. The general polarizer exerts no polarization effect on infrared light. For example, the most common preparation method of a polarizer is as follows: Firstly, a transparent plastic plate, such as, polyvinyl alcohol (PVA), is soaked in an aqueous solution of iodine and potassium iodide (I2/KI), allowing the iodide ion to diffuse into the PVA. After being slightly heated and then stretched, the PVA becomes longer and also narrower and thinner simultaneously. Due to irregular distribution of PVA molecules at any angle, the PVA molecules may be gradually and uniformly deflected to the direction of an action force in response to stretching by this action force, and iodine ions attached to the PVA may also have the directionality accordingly, thereby forming a long chain of iodide ions. Because iodide ions have good polarization properties, light (visible light), upon passing through the polarizer, may be converted into polarized light.

Figure 6:
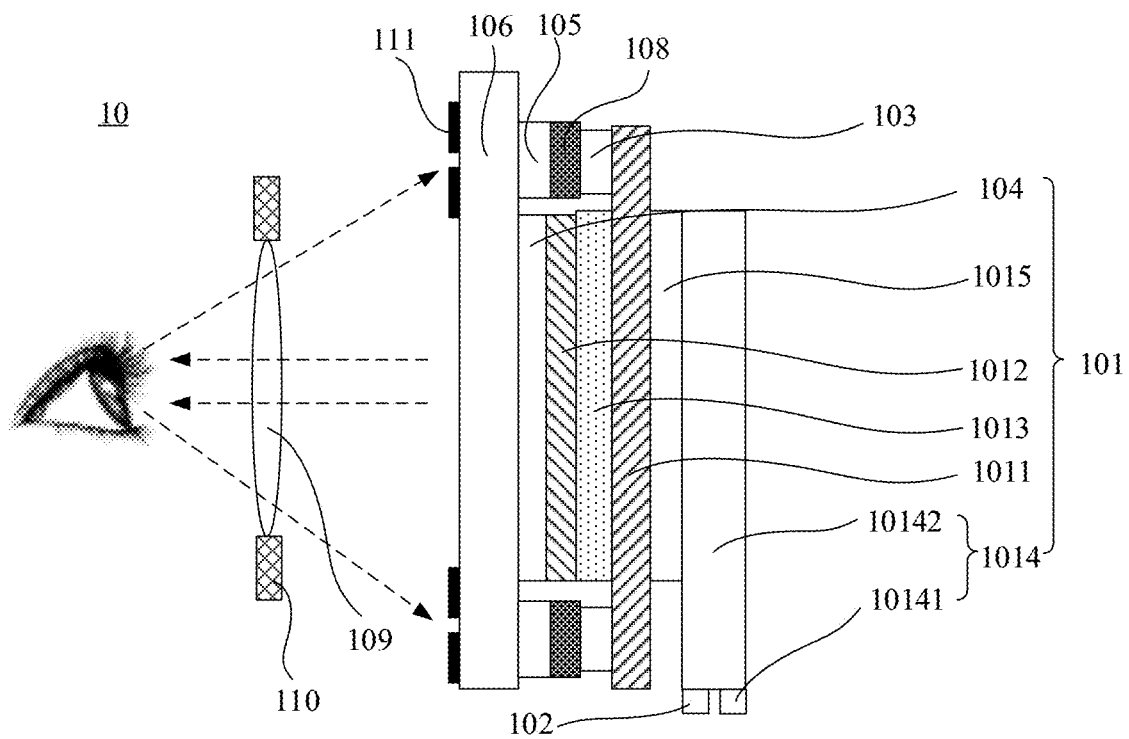
FIG. 6 is a schematic structural view of another wearable display device according to an embodiment of the present disclosure.

Optionally, as illustrated in FIG. 6, the display panel 101 also includes a backlight 1014 and a third polarizer layer 1015. The backlight 1014 is disposed on a side, distal from the color film substrate 1012, of the array substrate 1011. The backlight 1014 includes a second light-emitting element 10141 and a light guide plate 10142. The first light-emitting element 102 and the second light-emitting element 10141 are both disposed at one end of light guide plate 10142. The light guide plate 10142 is configured to convert light emitted by the first light-emitting element 102 and light emitted by the second light-emitting element 10141 into a surface light source.

As illustrated in FIG. 6, the third polarizer layer 1015 is disposed between the light guide plate 10142 and the array substrate 1011, and the third polarizer layer 1015 is configured to convert the light emitted by the second light-emitting element 10141 into polarized light and to transmit the light emitted by the first light-emitting element 102. The first polarizer layer 104 is disposed on a side, distal from the array substrate 1011, of the color film substrate 1012, and the third polarizer layer 1015 is configured to convert the light emitted by the first light light-emitting element to polarized light and to resolve the polarized light of the second light-emitting element 141 after being electrically modulated by the liquid crystal. The polarization direction of the third polarizer layer 1015 is intersected with the polarization direction of the first polarizer layer 104. It should be noted that, as illustrated in FIG. 6, the first polarizer layer 104 may serve as the upper polarizer layer of the liquid crystal display panel, and the third polarizer layer 1015 may serve as the lower polarizer layer of the liquid crystal display panel.

In this embodiment, the light emitted by the first light-emitting element 102 is transmitted to the first polarizer layer 104 by the third polarizer layer 1015 and is converted to polarized light by the first polarizer layer 104. The polarized light is irradiated to the eyes of the user. The eyes of the user reflect the polarized light, such that the polarized light diffusely reflected via the eyes of the user is transmitted through the second polarizer layer 105 and then irradiated to the photoelectric sensor assembly 103.

Optionally, in the solution illustrated in FIG. 6, the first polarizer layer 104 may be a wire grid polarizer or a polarized glass polarizer. The wire grid polarizer functions on light having a wavelength in the range of 250 nm to 4 μm. The polarized glass polarizer functions on light having a wavelength in the range of 340 nm to 2500 nm. That is, the wire grid polarizer and the polarized glass polarizer may not only convert the infrared light (the light emitted by the first light-emitting element 104) into polarized light but also resolve the polarized light of the visible light after electrically modulated by the liquid crystal (the polarized light which is the light emitted by the second light-emitting element 141 and transmitted through the third polarizer layer).

Moreover, in the solution illustrated in FIG. 6, the third polarizer layer 1015 is a general polarizer in a liquid crystal display panel. The general polarizer exerts no polarization effect on infrared light. For example, for the most common preparation method of a polarizer, reference may be made to the above description of the third polarizer layer 1015 and the fourth polarizer layer 1016 in FIG. 5, which is not repeated herein.

Figure 7:
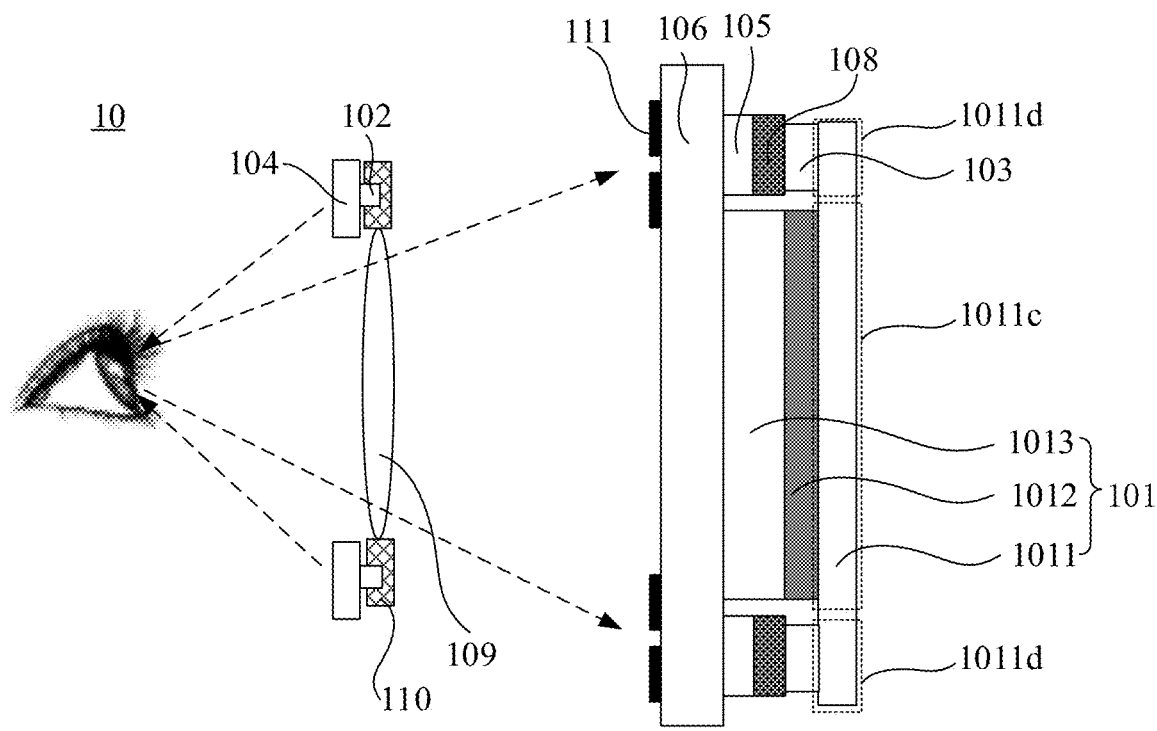
FIG. 7 is a schematic structural view of another wearable display device according to an embodiment of the present disclosure.

Optionally, the display panel 101 is an organic light-emitting diode (OLED) display panel 101. As illustrated in FIG. 7, the display panel 101 may include a base substrate 1011. A plurality of subpixels 1012 in the display panel 101 is disposed on one side of the base substrate 1011. Each subpixel 1012 includes a light-emitting unit and a pixel transistor. The pixel transistor in each subpixel 1012 is electrically connected to the light-emitting unit of the sub-pixel, and the pixel transistor is used to provide signals to the light-emitting unit to cause the light-emitting unit to emit light.

As illustrated in FIG. 7, the base substrate 1011 includes a third region 1011c and a fourth region 1011d. Orthographic projections of the light-emitting units of the plurality of sub-pixels 1012 on the base substrate 1011 are within the third region 1011c, and the pixel transistors of the plurality of sub-pixels 1012 are disposed in the third region 1011c. The switch transistor of the photoelectric sensor assembly 103 is disposed in the fourth region 1011d, and an orthographic projection of the photodiode of the photoelectric sensor assembly 103 on the base substrate 1011 is within the fourth region 1011d.

The third region 1011c of the base substrate 1011, and the light-emitting units of the sub-pixels 1012 in the third region 1011c of the base substrate 1011 may constitute the display region 101a of the display panel 101. Accordingly, the fourth region 1011d of the base substrate 1011 may constitute the peripheral region 101b of the display panel 101.

As illustrated in FIG. 7, the first light-emitting element 102 may be disposed on the display side of the display panel 101, and the first polarizer layer 104 is disposed on a side, distal from the display panel 101, of the first light-emitting element 102. That is, when the user wears the wearable display device 10, the first light-emitting element 102 may be disposed between the display panel 101 and the user, and the first polarizer layer 104 is disposed between the first light-emitting element 102 and the user. Also, the orthographic projection of the first polarizer layer 104 on the base substrate 1011 is not overlapped with the orthographic projection of the plurality of subpixels 1012 on the base substrate 1011. For example, the orthographic projection of the first polarizer layer 104 on the base substrate 1011 is within the fourth region 1011d.

As illustrated in FIG. 7, the display panel 101 may also include a third polarizer layer 1013 on a side, distal from the base substrate 1011, of the plurality of subpixels 1012. The third polarizer layer 1013 may be a circular polarizer for improving the contrast of the OLED display panel in a bright environment.

Figure 8:
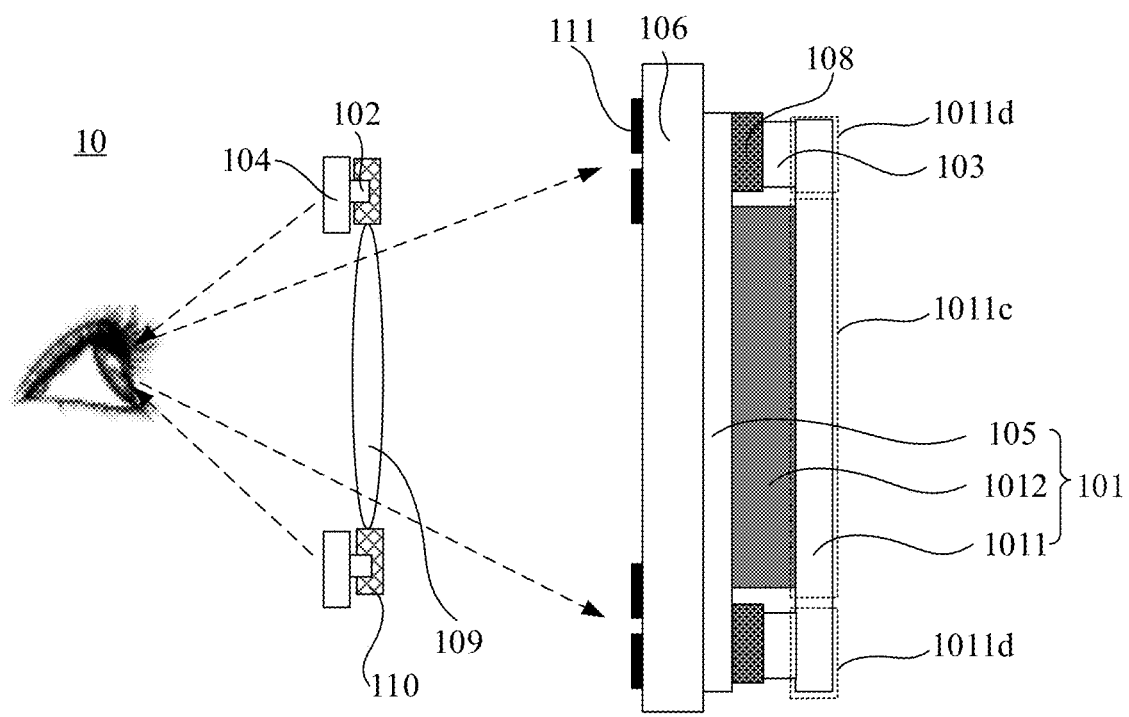
FIG. 8 is a schematic structural view of another wearable display device according to an embodiment of the present disclosure.

Optionally, as illustrated in FIG. 8, the first light-emitting element 102 is disposed on the display side of the display panel 101, and the first polarizer layer 104 is disposed on one side of the first light-emitting element 102 remote from the display panel 101. That is, when the user wears the wearable display device 10, the first light-emitting element 102 may be disposed between the display panel 101 and the user, and the first polarizer layer 104 is disposed between the first light-emitting element 102 and the user. The orthographic projection of the second polarizer layer 105 on the base substrate 1011 is overlapped with the orthographic projection of the plurality of subpixels 1012 on the base substrate 1011. It is noted that the second polarizer layer 105 may serve as a circular polarizer in an OLED display panel.

The light emitted by the first light-emitting element 102 is converted, via the first polarizer layer 104, into polarized light, and the polarized light is irradiated to the eyes of the user. The eyes of the user reflect the polarized light, such that the polarized light diffusely reflected via the eyes of the user is transmitted through the second polarizer layer 105 and then irradiated to the photoelectric sensor assembly 103.

Ambient light from the outside enters, through the second polarizer layer 105, the display panel 101, and is then converted into polarized light. The polarized light may change its direction after being reflected via the device within the display panel 101, and the polarized light may not be emitted from the second polarizer layer 105. It is thus possible to avoid the ambient light from being irradiated to the eyes of the user by reflection of the device within the display panel, thereby improving contrast of the OLED display panel in a bright environment.

Optionally, in the solution illustrated in FIG. 8, the second polarizer layer 105 may be a wire grid polarizer or a polarized glass polarizer. The wire grid polarizer functions on light having a wavelength in the range of 250 nm to 4 μm. The polarized glass polarizer functions on light having a wavelength in the range of 340 nm to 2500 nm. That is, the wire grid polarizer and the polarized glass polarizer may not only convert the infrared light (the light emitted by the first light-emitting element 102 transmitted through a first polarizer layer 104 and diffusely reflected via the eyes of the user) into polarized light, but also prevent the ambient light (visible light) from being emitted after being reflected via the device within the display panel.

As illustrated in FIGS. 5 to 8, the wearable display device 10 may further include a cover plate 106. The cover plate 106 may be disposed on the display side of the display panel 101, and an orthographic projection of the cover plate 106 on the display panel 101 is overlapped with the display panel 101. The cover plate 106 is made of a transparent material.

By disposing the cover plate 106 on the display side of the display panel 101, the display panel 101 may be protected, and the optical path of the light propagation may be optimized. Moreover, the cover plate 106 is made of a transparent material, and thus configuration the cover plate 106 does not affect the normal display of the display panel 101. Optionally, the cover plate 106 may be glass, or plastic, which is not limited herein.

In some embodiments, the switch transistor of photoelectric sensor assembly 103 is attached to the peripheral region 101b of the display panel 101. Alternatively, the display panel 101 may include a circuit board (not illustrated) attached to the peripheral region 101b, and the switch transistor of the photoelectric sensor assembly 103 is attached to the circuit board. The circuit board may be a flexible circuit board or a non-flexible circuit board.

In this embodiment, the switch transistors of the photoelectric sensor assemblies 103 are prepared independently of the display panel 101 and are not integrated in the display panel 101. The switch transistors and pixel transistors in photoelectric sensor assembly 103 are not prepared by a same preparation process.

Optionally, the display panel 101 may be a liquid crystal display panel or may be an OLED display panel, which is not limited herein. For example, in the case that the display panel 101 is a liquid crystal display panel, the switch transistor may be attached to the second region 1011b of the array substrate 1011. In the case that the display panel 101 is an OLED display panel, the switch transistor may be attached to the fourth region 1011d of the base substrate 1011 of the display panel 101.

It should be noted that in the case that the switch transistor is attached to the circuit board of the display panel 101, the arrangement of the plurality of photoelectric sensor assemblies 103 generally refers to the arrangement of the photodiodes in the plurality of photoelectric sensor assemblies 103.

Exemplarily, the plurality of first photoelectric sensor assemblies 103a being arranged along the first direction X indicates that: the photodiodes in the plurality of first photoelectric sensor assemblies 103a are arranged along the first direction X. The plurality of second photoelectric sensor assemblies 103b being arranged along the second direction Y indicates that: the photodiodes in the plurality of second photoelectric sensor assemblies 103b are arranged along the second direction Y.

Figure 9:
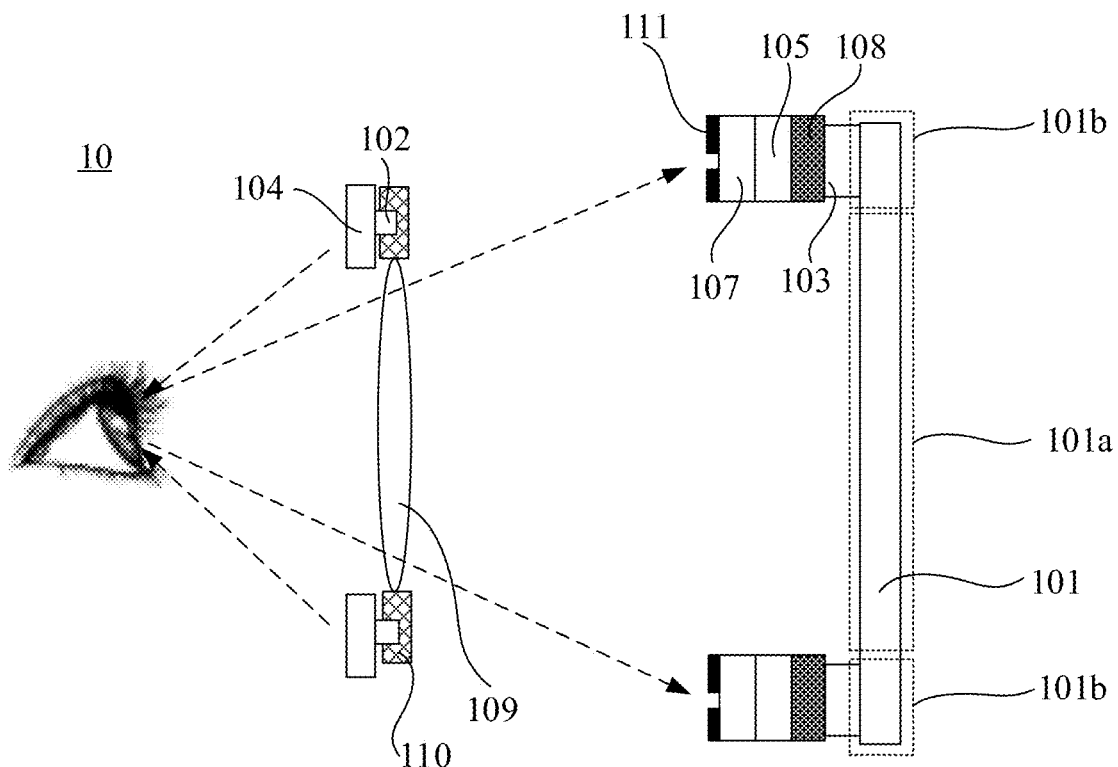
FIG. 9 is a schematic structural view of another wearable display device according to an embodiment of the present disclosure.

In this embodiment, as illustrated in FIG. 9, the first light-emitting element 102 is disposed on the display side of the display panel 101, and the first polarizer layer 104 is disposed on the side, distal from the display panel 101, of the first light-emitting element 102. Further, the wearable display device 10 further includes a media layer 107. The media layer 107 may be disposed on a side, distal from the photoelectric sensor assembly 103, of the second polarizer layer 105.

Optionally, the media layer 10 is made of a transparent material. For example, the medial layer may be made of glass or plastic, which is not limited herein.

As illustrated in FIGS. 5 to 9, the wearable display device 10 may further include a plurality of filters 108 in one-to-one correspondence to the plurality of photoelectric sensor assemblies 103. Each filter 108 may be disposed on a side, distal from the display panel 101, of the corresponding photoelectric sensor assembly 103, and an orthographic projection of each filter 108 on the display panel covers orthographic projection of the corresponding photoelectric sensor assembly 103 on the display panel. The filters 108 may be configured to absorb infrared light and absorb visible light.

By disposing the filter 108 on the side, distal from the display panel 101, of the photoelectric sensor assembly 103 to filter out visible light, the light emitted by the display panel 101 may be prevented from affecting the light signal received by photoelectric sensor assembly 103, thereby ensuring the accuracy of the determined gaze position.

Furthermore, as illustrated in FIGS. 5 to 9, the wearable display device 10 may further include a lens 109 and lens frame 110. The lens 109 may be disposed on the display side of the display panel 101 through which a user may view the image displayed by the display panel 101. The lens frame 110 may be disposed at an edge of the lens for supporting and securing the lens 109.

As illustrated in FIGS. 5, 7 to 9, where the first light-emitting element 102 is disposed on the display side of the display panel 101, the first light-emitting element 102 may be fixed to a side, distal from the display panel 101, of the lens frame 110.

In this embodiment, as illustrated in FIGS. 5 to 9, the wearable display device 10 may further include an optical structure 111. The optical structure 111 may be disposed on a side, distal from the display panel 101, of the second polarizer layer 105. The optical structure may include a light blocking region and a plurality of light-transmissive regions. Each of the light-transmissive regions may be configured to transmit an optical signal to at least one photoelectric sensor assembly 103. That is, light reflected via the eyes of the user may be transmitted from the light-transmissive region to the photoelectric sensor assembly 103.

Figure 10:
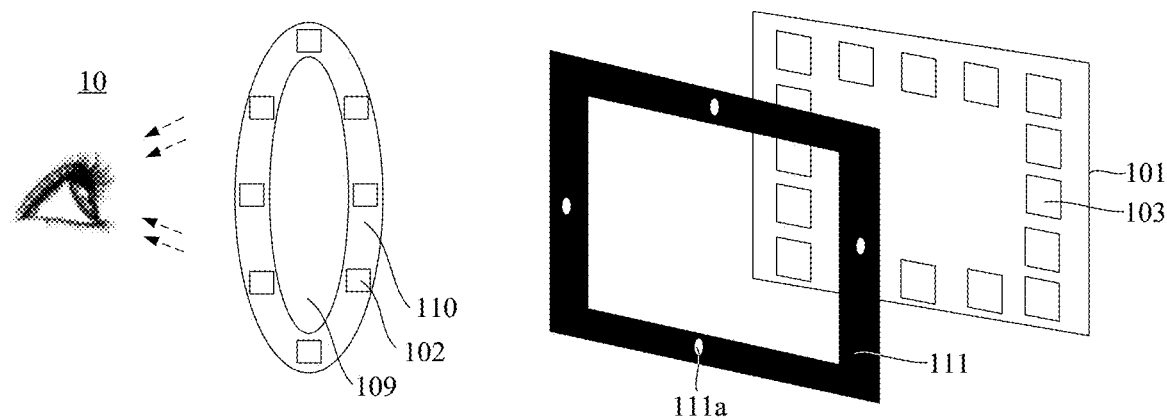
FIG. 10 is a schematic structural view of another wearable display device according to an embodiment of the present disclosure.

As illustrated in FIG. 10, the optical structure 111 may be of an annular structure, and the orthographic projection of the optical structure 111 on the display panel 101 is within the peripheral region 101b. Optionally, the light blocking region of the optical structure 111 may be made of an opaque material. The optical structure 111 may be provided with through holes 111a, and the light-transmissive region may be composed of the through holes on the optical structure 111. Four through holes 111a are show in FIG. 10. The four through holes 111a are respectively disposed in the middle of a side of the optical structure 111.

Optionally, another number of through holes may also be provided in the optical structure 111. Optionally, the optical structure 111 may be provided with a greater number of through holes in the optical structure 111, which are arranged in an array, and the light-transmissive region may be composed of the array of holes. Illustratively, the number of through holes on the optical structure 111 may be the same as, and one-to-one with, the number of photoelectric sensor assemblies 103 included on the wearable display device 10.

Optionally, the optical structure 111 may be provided with a slit, and the light-transmissive region may be composed of the slit on the optical structure 111. Alternatively, the optical structure 111 may be provided with a plurality of slits that are arranged in an array, and the light-transmissive region may be composed of the array of slits. Alternatively, the light-transmissive region of the optical structure 111 may be composed of a light-transmissive structure such as a lens or a lenticular lens.

Figure 11:
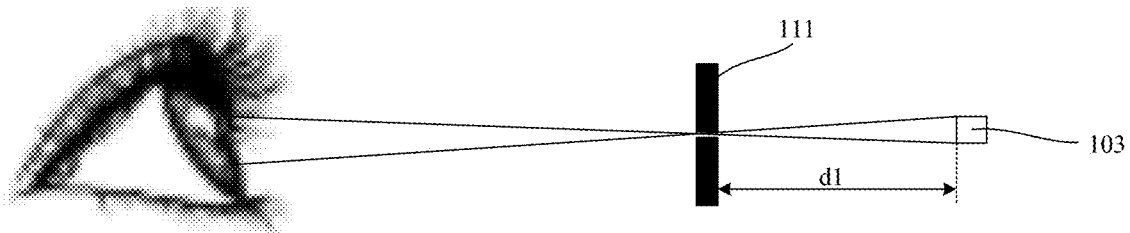
FIG. 11 is a schematic view of an optical structure and a photoelectric sensor assembly according to an embodiment of the present disclosure.
Figure 12:
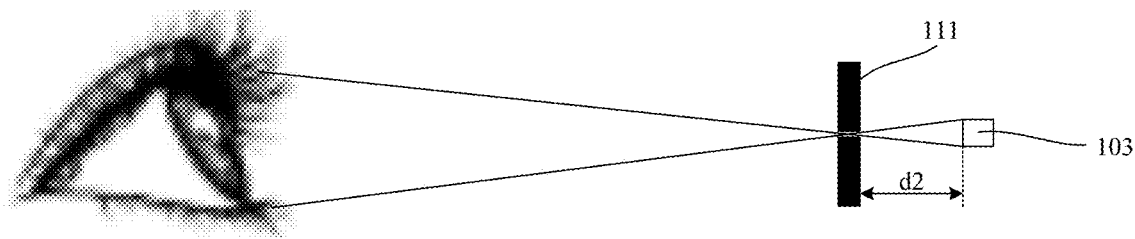
FIG. 12 is a schematic view of another optical structure and a photoelectric sensor assembly according to an embodiment of the present disclosure.

In the embodiments of the present disclosure, in the wearable display device 10 illustrated in FIGS. 5 to 8, the display side of the display panel 101 is provided with a cover plate 106, and the cover plate 106 has a thickness. FIG. 11 is a schematic view of an optical structure and a photoelectric sensor assembly according to an embodiment of the present disclosure. FIG. 12 is a schematic view of another optical structure and a photoelectric sensor assembly according to an embodiment of the present disclosure. The wearable display device 10 illustrated in FIG. 11 includes a cover plate 106 on the display side of the display panel 101. The wearable display device 10 illustrated in FIG. 12 does not include a cover plate 106 on the display side of the display panel 101.

As illustrated in FIGS. 11 and 12, the distance d1 between the optical structure 111 and photoelectric sensor assembly 103 in the solution with the cover plate 106 is greater than the distance d2 between the optical structure 111 and photoelectric sensor assembly 103 in the solution without the cover plate 106. That is, the wearable display device 10 provided with the cover plate 106 may reduce the region corresponding to the optical signal that may be received by each of the photoelectric sensor assemblies 103, such that the accuracy of the optical signal received by the photoelectric sensor assembly 103 is increased, thereby improving the accuracy of the determined gaze position.

In addition, in the wearable display device 10 illustrated in FIG. 9, the display side of the display panel 101 is not provided with a cover plate, but is provided with a media layer 107. The media layer 107 has a thickness. Thus, in FIG. 9, the distance d between the optical structure 111 and the photoelectric sensor assembly 103 in the solution with the media layer 107 is greater than that in the solution without the media layer. In this way, the region corresponding to the optical signal that may be received by each of the photoelectric sensor assemblies 103 may be reduced, and the accuracy of the optical signal received by photoelectric sensor assembly 103 may be increased, thereby improving the accuracy of the determined gaze position.

In summary, the embodiments of the present disclosure provide a wearable display device. Because the wearable display device has a high efficiency in processing the electric signal transmitted by each of the photoelectric sensor assemblies, the wearable display device may quickly determine the gaze position of eyes of a user on the display panel based on an electric signal transmitted by each of the photoelectric sensor assemblies. In this way, the efficiency of displaying images by the display panel is increased, and thus a higher refresh rate of the display panel is achieved.

Figure 13:
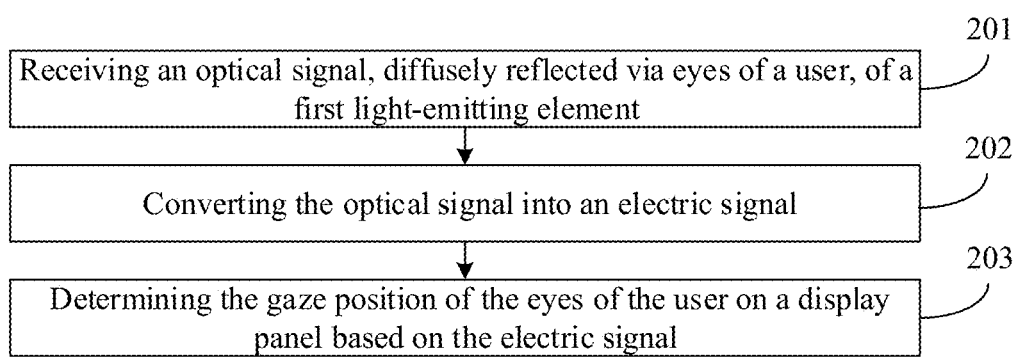
FIG. 13 is a flowchart of a method for determining a gaze position according to an embodiment of the present disclosure.

FIG. 13 is a flowchart of a method for determining a gaze position according to an embodiment of the present disclosure. The method may be applied in the wearable display device 10 according to the embodiments described above. As illustrated in FIG. 13, the method may include:

In step 201, an optical signal, diffusely reflected via eyes of a user, of a first light-emitting element.

In this embodiment, the wearable display device 10 includes a display panel 101 and a plurality of photoelectric sensor assemblies 103. The display panel 101 includes a display region 101a and a peripheral region 101b surrounding the display region 101a. The plurality of the photoelectric sensor assemblies 103 may be disposed in the peripheral region 101b.

The light emitted by the first light-emitting element 102 passes through the first polarizer layer 104 and then is irradiated to the eyes of the user. The eyes of the user may reflect the polarized light after passing through the first polarizer layer 104. The polarized light specularly reflected via the eyes of the user may not be transmitted through the second polarizer layer 105, and the polarized light diffusely reflected via the eyes of the user may be transmitted through the second polarizer layer 105.

Accordingly, the photoelectric sensor assemblies 103 may not receive light that is specularly reflected via the eyes of the user, but may merely receive light that is diffusely reflected via the eyes of the user. That is, in the embodiments of the present disclosure, the optical signal of the first light-emitting element 102 reflected via the eyes of the user refers to the optical signal, diffusely reflected via the eyes of the user, of the first light-emitting element 102.

In step 202, the optical signal is converted into an electric signal.

In the case that the photoelectric sensor assembly 103 receives the light signal, diffusely reflected via the eyes of the user, of the first light-emitting element 102, the diffusely reflected optical signal of the first light-emitting element 102 may be converted into an electric signal.

In step 203, a gaze position of the eyes of the user on a display panel is determined based on the electric signal.

In the embodiments of the present disclosure, the wearable display device further includes a processor coupled to each of the photoelectric sensor assemblies 103 and capable of receiving the electric signal transmitted by each of the photoelectric sensor assemblies. In the case that the electric signal transmitted by each of the photoelectric sensor assemblies 103 is received, the gaze position of the eyes of the user on the display panel 101 may be determined based on the signal values of the electric signal transmitted by each of the photoelectric sensor assemblies and the position of the at least one photoelectric sensor assembly.

In the embodiments of the present disclosure, the position of each of the photoelectric sensor assemblies may be pre-stored in the processor. Because different regions of the human eyes are different in reflectivity to light (e.g., infrared light), the optical signals, reflected via different regions of the human eyes, received by the photoelectric sensor assemblies are different. The photoelectric sensor assemblies 103 have different signal values of electric signals converted from different optical signals, and thus the wearable display device may determine the gaze position of the eyes of the user on display panel 101 based on the signal values of electric signals and the position of the photoelectric sensor assemblies 103.

In general, the amount of data of the electric signals is small, and the amount of data of the images is large. Therefore, the processing efficiency of the wearable display device for electric signals is higher than that for images. In the embodiments of the present disclosure, the processor has a high processing efficiency for the electric signal transmitted by each of the photoelectric sensor assemblies 103, such that the gaze position of the eyes of the user on display panel 101 is quickly determined. In this way, the efficiency of displaying images by the display panel 101 is improved, and thus a higher refresh rate of the display panel is achieved.

In summary, the embodiments of the present disclosure provide a wearable display device whose processing efficiency is higher for the electric signal transmitted by each of the photoelectric sensor assemblies, such that the wearable display device may more quickly determine the fixation position of the eyes of the user on the display panel based on the electric signal transmitted by each of the photoelectric sensor assemblies. In this way, the efficiency of displaying images by the display panel is improved, and thus a higher refresh rate of the display panel is achieved. Because the solutions according to the embodiments of the present disclosure suppress specular reflection by the eyes of the user of the light emitted by the first light-emitting element, it is possible to avoid the effect of the specularly reflected light on determining the gaze position, thereby ensuring the accuracy of the determined gaze position.

Figure 14:
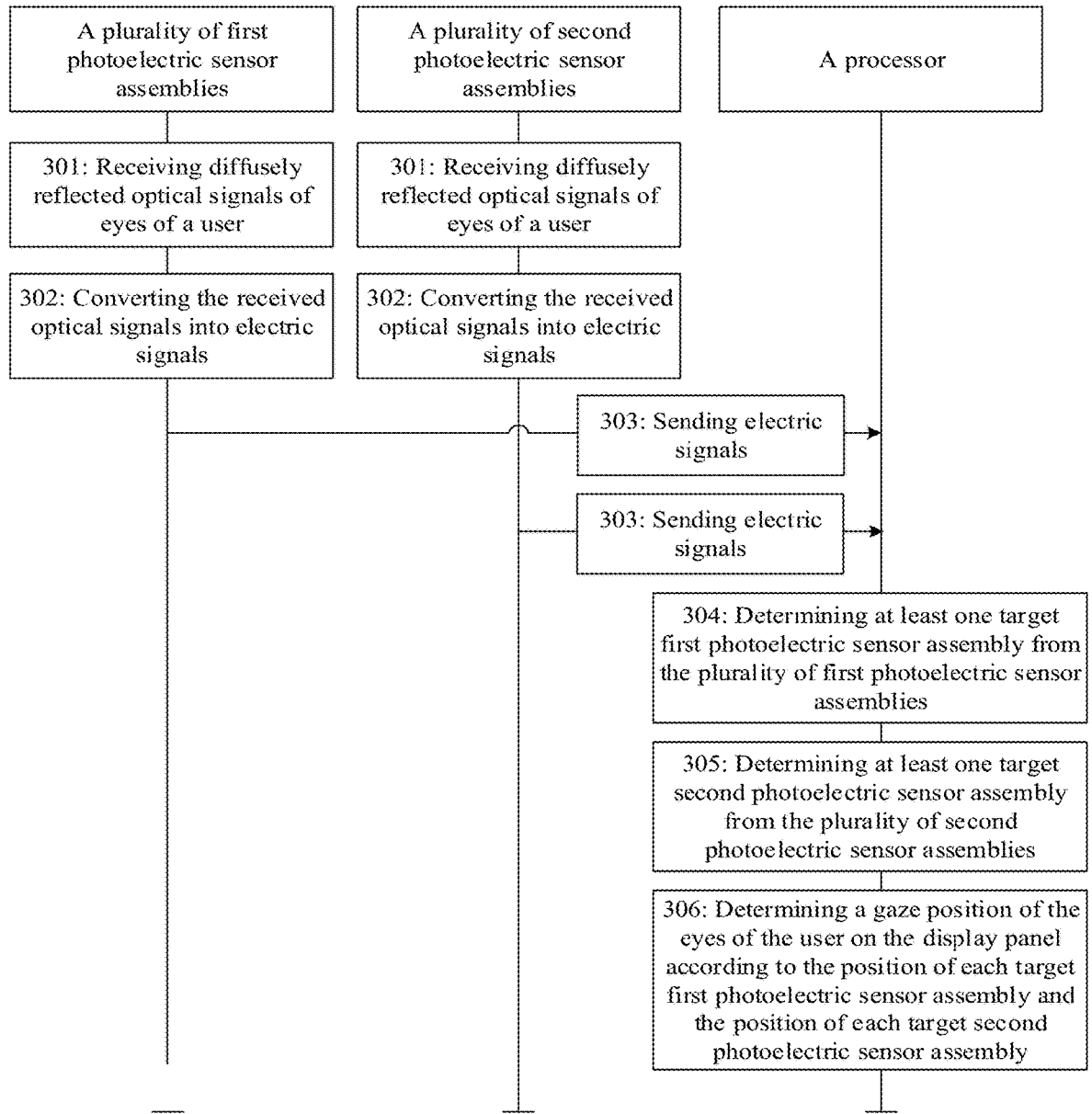
FIG. 14 is a flowchart of another method for determining a gaze position according to an embodiment of the present disclosure.

FIG. 14 is a flowchart of another method for determining a gaze position according to an embodiment of the present disclosure. The method may be applied in the wearable display device 10 according to the embodiments described above. As illustrated in FIG. 14, the method may include:

In step 301, a plurality of first photoelectric sensor assemblies, and a plurality of second photoelectric sensor assemblies receive diffusely reflected optical signals of eyes of a user.

In the embodiments of the present disclosure, the wearable display device 10 includes a display panel 101 and a plurality of photoelectric sensor assemblies 103. The display panel 101 includes a display region 101a and a peripheral region 101b surrounding the display region 101a. The user is typically disposed on the display side of the display panel 101 to view the images displayed in the display panel 101. Further, the plurality of photoelectric sensor assemblies 103 may be disposed on the display side of the display panel 101 and disposed in the peripheral region 101b.

The light emitted by the first light-emitting element 102 may be irradiated to the eyes of the user after passing through the first polarizer layer 104. The eyes of the user may reflect the polarized light transmitted by the first polarizer layer 104. The polarized light specularly reflected via the eyes of the user may not be transmitted through the second polarizer layer 105, and the polarized light diffusely reflected via the eyes of the user may be transmitted through the second polarizer layer 105.

Accordingly, each of the photoelectric sensor assemblies 103 may not receive light specularly reflected via the eyes of the user, and may merely receive light diffusely reflected via the eyes of the user. That is, in the embodiments of the present disclosure, the optical signal of the first light-emitting element 102 reflected via the eyes of the user refers to the optical signal, diffusely reflected via the eyes of the user, of the first light-emitting element 102.

Optionally, the plurality of photoelectric sensor assemblies 103 include a plurality of first photoelectric sensor assemblies 103a arranged along a first direction X and a plurality of second photoelectric sensor assemblies 103b arranged along a second direction Y. Either the plurality of first photoelectric sensor assemblies 103a or the plurality of second photoelectric sensor assemblies 103b are capable of receiving optical signals diffusely reflected via the eyes of the user.

In step 302, each photoelectric sensor assembly from the plurality of first photoelectric sensor assemblies and the plurality of second photoelectric sensor assemblies converts the received optical signal into an electric signal.

In the embodiments of the present disclosure, in the case that the plurality of first photoelectric sensor assemblies 103a and the plurality of second photoelectric sensor assemblies 103b receive the optical signals, each of the photoelectric sensor assemblies 103 may convert the received optical signal into the electric signal.

Further, the signal value of the converted electric signal is positively correlated to the signal value of the optical signal received by the photoelectric sensor assembly 103. That is, the larger the signal value of the optical signal received by the photoelectric sensor assembly 103, the larger the signal value of the electric signal converted from the optical signal received by the photoelectric sensor assembly 103; and the smaller the signal value of the optical signal received by the photoelectric sensor assembly, the smaller the signal value of the electric signal converted from the optical signal received by the photoelectric sensor assembly. The signal value of the optical signal may be used to indicate the intensity of the light.

In step 303, each of the photoelectric sensor assemblies sends the electric signal to a processor.

In the embodiments of the present disclosure, the processor in the wearable display device 10 may be connected to each of the photoelectric sensor assemblies 103. each of the photoelectric sensor assemblies 103 may send electric signals to the processor.

In step 304, the processor determines at least one target first photoelectric sensor assembly from the plurality of first photoelectric sensor assemblies.

In the embodiments of the present disclosure, In the case that the processor receives the electric signals transmitted by the plurality of first photoelectric sensor assemblies 103a, at least one target first photoelectric sensor assembly may be determined from the plurality of first photoelectric sensor assemblies 103a. Further, the processor may also determine a position of each target first photoelectric sensor assembly, e.g., determine a coordinate value for each target first photoelectric sensor assembly.

The signal value of the electric signal sent to the processor by the target first photoelectric sensor assembly is less than or equal to the first threshold. The first threshold may be a fixed value pre-stored in the processor. Alternatively, the first threshold may be determined by the processor based on the received signal values of the electric signals of the plurality of first photoelectric sensor assemblies 103a.

Exemplarily, the processor may sort the signal values of the N electric signals transmitted by the N first photoelectric sensor assemblies 103a in an ascending order, and determine the signal value in the $n'$ position as the first threshold. N is an integer greater than 1 and n is an integer greater than 1 and less than N/2. Optionally, the processor may determine the minimum of the signal value of the received electric signals of the plurality of first photoelectric sensor assemblies 103a as the first threshold In the case that the first threshold value is the minimum of the signal value of the electric signals transmitted by the plurality of the first photoelectric sensor assemblies 103a, the processor may determine a target first photoelectric sensor assembly from the plurality of first photoelectric sensor assemblies 103a. Thus, the processor may determine a first coordinate value of the target first photoelectric sensor assembly with a minimum signal value of the electric signal transmitted by the plurality of first photoelectric sensor assemblies 103a.

Optionally, the first coordinate value may be expressed in terms of (first abscissa value, first ordinate value). The first abscissa value may be the coordinate value of the target first photoelectric sensor assembly in the first direction X, and the first vertical coordinate value may be the coordinate value of the target first photoelectric sensor assembly in the second direction Y. Because the plurality of first photoelectric sensor assemblies 103a are arranged along the first direction X, the coordinate values of each of the first photoelectric sensor assembly 103a in the second direction Y may be 0s. That is, the first vertical coordinate value of the target first photoelectric sensor assembly may be 0.

In step 305, the processor determines at least one target second photoelectric sensor assembly from the plurality of second photoelectric sensor assemblies.

In the embodiments of the present disclosure, in the case that the processor receives the electric signals transmitted by the plurality of second photoelectric sensor assemblies 103b, at least one target second photoelectric sensor assembly may be determined from the plurality of second photoelectric sensor assembly 103b. Further, the processor may also determine a position of each target second photoelectric sensor assembly, e.g., determine a coordinate value for each target second photoelectric sensor assembly.

The signal value of the electric signal sent to the processor by the target second photoelectric sensor assembly is less than or equal to the second threshold value. The second threshold may be a fixed value pre-stored in the processor. Alternatively, the second threshold may be determined by the processor based on the received signal values of the electric signals of the plurality of second photoelectric sensor assemblies 103b.

Exemplarily, the processor may sort the signal values of the M electric signals transmitted by the M second photoelectric sensor assemblies 103b in an ascending order, and determine the signal value in the $m^{th}$ position as the second threshold. M is an integer greater than 1 and n is an integer greater than 1 and less than M/2. Optionally, the processor may determine the minimum of the signal value of the received electric signals of the plurality of second photoelectric sensor assemblies 104b as the second threshold.

In the case that the second threshold value is the minimum of the signal value of the electric signals transmitted by the plurality of the second photoelectric sensor assemblies 103b, the processor may determine a target second photoelectric sensor assembly from the plurality of second photoelectric sensor assemblies 103b. Thus, the processor may determine a second coordinate value of the target second photoelectric sensor assembly with a minimum signal value of the electric signal transmitted by the plurality of second photoelectric sensor assemblies 103b.

Optionally, the second coordinate value may be expressed in terms of (second abscissa value and second ordinate value). The second abscissa value may be the coordinate value of the target second photoelectric sensor assembly in the first direction X, and the second ordinate value may be the coordinate value of the target second photoelectric sensor assembly in the second direction Y. Because the plurality of second photoelectric sensor assemblies 103b are arranged along the second direction Y, the coordinate values of each of the second photoelectric sensor assemblies 103b in the first direction X may be 0s. That is, the second abscissa value of the target second photoelectric sensor assembly may be 0.

In step 306, the processor determines a gaze position of the eyes of the user on the display panel according to the position of each target first photoelectric sensor assembly and the position of each target second photoelectric sensor assembly.

In the embodiments of the present disclosure, in the case that the processor determines the position of each target first photoelectric sensor assembly and the position of each target second photoelectric sensor assembly, the gaze position of the eyes of the user on the display panel 101 may be determined according to the position of each target first photoelectric sensor assembly and the position of each target second photoelectric sensor assembly.

In some embodiments, assuming that the processor determines a plurality of target first photoelectric sensor assemblies, the processor may determine a first coordinate value of each target first photoelectric sensor assembly in the plurality of target first photoelectric sensor assemblies. The first coordinate value of each target first photoelectric sensor assembly may be expressed in terms of (first abscissa value and first ordinate value). Afterwards, the processor may determine a first abscissa average value of the first abscissa value of the plurality of target first photoelectric sensor assemblies and a first ordinate average value of the first ordinate value of the plurality of target first photoelectric sensor assemblies.

Because the first ordinate value of each target first photoelectric sensor assembly is 0, the first ordinate average value of the first ordinate value of the plurality of target first photoelectric sensor assemblies is also 0.

Accordingly, assuming that the processor determines a plurality of target second photoelectric sensor assemblies, the processor may determine a second coordinate value for each target second photoelectric sensor assembly in the plurality of target second photoelectric sensor assemblies. The second coordinate value of each target second photoelectric sensor assembly may be expressed in terms of (second abscissa value, second ordinate value). Afterwards, the processor may determine a second abscissa average value of the second abscissa value of the plurality of target second photoelectric sensor assembly, and a second ordinate average value of the second ordinate value of the plurality of target second photoelectric sensor assembly.

Because the second abscissa value of each target second photoelectric sensor assembly is 0, an average value of the second abscissa values of the plurality of target second photoelectric sensor assemblies is also 0.

Afterwards, the processor may determine the gaze position of the eyes of the user on the display panel 101 based on the first abscissa average value and the second ordinate average value. For example, the gaze position may be expressed by coordinates of the gaze position (first abscissa average value and second ordinate average value).

In some embodiments, assuming that the processor determines a target first photoelectric sensor assembly, the processor may determine a first coordinate value for the target first photoelectric sensor assembly. The first coordinate value of the target first photoelectric sensor assembly may be expressed in terms of (first abscissa value and first ordinate value).

Accordingly, assuming that the processor determines a target second photoelectric sensor assembly, the processor may determine a second coordinate value for the target second photoelectric sensor assembly. The second coordinate value of the target second photoelectric sensor assembly may be expressed in terms of (second abscissa value and second ordinate value).

Afterwards, the processor may determine the gaze position of the eyes of the user on the display panel 101 based on the first abscissa value and the second ordinate value. For example, the gaze position may be expressed by coordinates of a gaze point (the first coordinate value and the second coordinate value).

It is noted that, upon determining the gaze position, the processor may render the image to be displayed in the display panel 101 based on the gaze position and send the rendered image to be displayed to the drive circuit of the display panel 101, such that the drive circuit drives the display panel 101 display based on the rendered image to be displayed. Alternatively, the processor may send the gaze position to another processor after determining the gaze position. The another processor renders the image to be displayed in the display panel 101 based on the gaze position and sends the rendered image to be displayed to the drive circuit of the display panel 101, such that the drive circuit drives the display panel 101 display based on the rendered image to be displayed.

The rendering of to-be-displayed image may be to partially render the region where the gaze point is disposed in the image to be displayed. The region of the gaze point refers to a target region centered on the gaze position. The shape of the target region may be circular, rectangular, or the like, and the size of the target region may be a pre-stored size in the processor.

It should also be noted that the sequence of steps of the method for determining the gaze position according to the embodiments of the present disclosure may be adjusted appropriately, and the steps may be scaled accordingly. For example, step 305 is performed synchronously with step 304. Any variations within the scope of the technology disclosed in this disclosure made by persons of ordinary skill in the art fall within the protection scope of the present disclosure, and are therefore not repeated herein.

In summary, the embodiments of the present disclosure provide a method for determining a gaze position. The wearable display device has a high processing efficiency for the electric signal transmitted by each of the photoelectric sensor assemblies, such that the gaze position of the eyes of the user on display panel is quickly determined based on the electric signal transmitted by each of the photoelectric sensor assemblies. In this way, the efficiency of displaying images by the display panel is improved, and thus a higher refresh rate of the display panel is achieved.

An embodiment of the present disclosure further provides a computer-readable storage medium. The computer-readable storage medium stores one or more instructions therein, wherein the one or more instructions, when loaded and executed by a wearable display device, cause the wearable display device to perform the method as described above.

An embodiment of the present disclosure further provides a computer program product storing one or more instructions therein, wherein the one or more instructions, when loaded and executed by a computer, cause the computer to perform the method as described above.

Described above are merely exemplary embodiments of the present disclosure and are not intended to limit the present disclosure. Within the spirit and principles of the present disclosure, any modifications, equivalent substitutions, improvements, and the like fall within the protection scope of the present disclosure.

What is claimed is:

1. A wearable display device, comprising:
   a display panel, comprising a display region and a peripheral region surrounding the display region;
   a first light-emitting element, configured to emit light to be irradiated to eyes of a user;
   a plurality of photoelectric sensor assemblies in the peripheral region, each of the photoelectric sensor assemblies being configured to receive an optical signal, reflected via the eyes of the user, of the first light-emitting element, and convert the optical signal into an electric signal, the electric signal being configured to determine a gaze position of the eyes of the user on the display panel;
   a first polarizer layer, disposed on a light-emitting side of the first light-emitting element; and
   a second polarizer layer, disposed on a side, distal from the display panel, of the photoelectric sensor assembly, a polarization direction of the second polarizer layer being intersected with a polarization direction of the first polarizer layer.

2. The wearable display device according to claim 1, wherein the polarization direction of the second polarizer layer is perpendicular to the polarization direction of the first polarizer layer.

3. The wearable display device according to claim 2, wherein the first light-emitting element is an infrared light-emitting diode.

4. The wearable display device according to claim 2, wherein each of the photoelectric sensor assemblies comprises a switch transistor and a photodiode electrically connected to the switch transistor; and the display panel comprises a plurality of sub-pixels in the display region, each of the sub-pixels comprising at least one pixel transistor;
   wherein the switch transistor and the pixel transistor are prepared by a same preparation process.

5. The wearable display device according to claim 1, wherein the first light-emitting element is an infrared light-emitting diode.

6. The wearable display device according to claim 5, wherein each of the photoelectric sensor assemblies comprises a switch transistor and a photodiode electrically connected to the switch transistor; and the display panel comprises a plurality of sub-pixels in the display region, each of the sub-pixels comprising at least one pixel transistor;
   wherein the switch transistor and the pixel transistor are prepared by a same preparation process.

7. The wearable display device according to claim 1, wherein each of the photoelectric sensor assemblies comprises a switch transistor and a photodiode electrically connected to the switch transistor; and the display panel comprises a plurality of sub-pixels in the display region, each of the sub-pixels comprising at least one pixel transistor;
   wherein the switch transistor and the pixel transistor are prepared by a same preparation process.

8. The wearable display device according to claim 7, wherein
   the display panel is a liquid crystal display panel; and the display panel comprises an array substrate, a color film substrate, and a liquid crystal layer between the array substrate and the color film substrate; wherein the array substrate comprises a first region and a second region, and an orthographic projection of either the color film substrate or the liquid crystal layer on the array substrate is within the first region;
   wherein the pixel transistor is disposed in the first region, the switch transistor is disposed in the second region, and an orthographic projection of the photodiode on the array substrate is within the second region.

9. The wearable display device according to claim 8, wherein the first light-emitting element is disposed on a display side of the display panel; and the first polarizer layer is disposed on a side, distal from the display panel, of the first light-emitting element and is configured to convert light emitted by the first light-emitting element into polarized light.

10. The wearable display device according to claim 8, wherein the display panel further comprises a third polarizer layer and a backlight disposed on a side, distal from the color film substrate, of the array substrate, the backlight comprising a second light-emitting element and a light guide plate; wherein
- the first light-emitting element and the second light-emitting element are both disposed at an end of the light guide plate, and the light guide plate is configured to convert the light emitted by the first light-emitting element and light emitted by the second light-emitting element into a surface light source; and
- the third polarizer layer is disposed between the light guide plate and the array substrate and is configured to convert the light emitted by the second light-emitting element into polarized light and to transmit the light emitted by the first light-emitting element; and the first polarizer layer is disposed on a side, distal from the array substrate, of the color film substrate and is configured to convert the light of the first light-emitting element into polarized light and resolve the polarized light of the second light-emitting element being electrically modulated by the liquid crystal, a polarization direction of the third polarizer layer being intersected with the polarization direction of the first polarizer layer.

11. The wearable display device according to claim 7, wherein the display panel is an organic light-emitting diode display panel; and the display panel comprises a base substrate, the plurality of sub-pixels being disposed on a side of the base substrate, each of the sub-pixels further comprising a light-emitting unit; wherein the base substrate comprises a third region and a fourth region, an orthographic projection of the light-emitting unit on the base substrate being within the third region;
- wherein the pixel transistor is disposed in the third region, the switch transistor is disposed in the fourth region, and an orthographic projection of the photodiode on the base substrate is within the fourth region.

12. The wearable display device according to claim 11, wherein the first light-emitting element is disposed on a display side of the display panel; and the first polarizer layer is disposed on a side, distal from the display panel, of the first light-emitting element and is configured to convert the light emitted by the first light-emitting element into polarized light.

13. The wearable display device according to claim 8, further comprising: a cover plate;
- wherein the cover plate is disposed on a display side of the display panel, an orthographic projection of the cover plate on the display panel covers the display panel, and the cover plate is made of a transparent material.

14. The wearable display device according to claim 1, wherein each of the photoelectric sensor assemblies comprises a switch transistor and a photodiode electrically connected to the switch transistor; and the display panel comprises a plurality of sub-pixels in the display region, each of the sub-pixels comprising at least one pixel transistor, the switch transistor being attached to the display panel.

15. The wearable display device according to claim 14, wherein
- the first light-emitting element is disposed on a display side of the display panel; and the first polarizer layer is disposed on a side, distal from the display panel, of the first light-emitting element and is configured to convert the light emitted by the first light-emitting element into polarized light; and
- the wearable display device further comprises a media layer;
- wherein the media layer is disposed on a side, distal from the photoelectric sensor assembly, of the second polarizer layer, and the media layer is made of a transparent material.

16. The wearable display device according to claim 1, further comprising: a plurality of filters in one-to-one correspondence to the plurality photoelectric sensor assembly, each of the filters being disposed on a side, distal from the display panel, of the corresponding photoelectric sensor assembly;
- wherein the filters are configured to transmit infrared light and absorb visible light.

17. The wearable display device according to claim 1, further comprising: a lens and a lens frame;
- wherein the lens is disposed on the display side of the display panel, and the lens frame is disposed at an edge of the lens.

18. The wearable display device according to claim 1, wherein the peripheral region comprises: a first region extending along a first direction and a second region extending along a second direction, the first direction being intersected with the second direction; the plurality of photoelectric sensor assemblies comprise a plurality of first photoelectric sensor assemblies and a plurality of second photoelectric sensor assemblies;
- wherein the plurality of first photoelectric sensor assemblies are disposed in the first region and arranged along the first direction, and the plurality of second photoelectric sensor assemblies are disposed in the second region and arranged along the second direction.

19. A method for determining a gaze position, applicable to a wearable display device, the method comprising:
- receiving an optical signal, diffusely reflected via eyes of a user, of a first light-emitting element;
- converting the optical signal into an electric signal; and
- determining the gaze position of the eyes of the user on a display panel based on the electric signal;
- and the wearable display device comprises: a display panel, comprising a display region and a peripheral region surrounding the display region; a first light-emitting element, configured to emit light to be irradiated to eyes of a user; a plurality of photoelectric sensor assemblies in the peripheral region, each of the photoelectric sensor assemblies being configured to receive an optical signal, reflected via the eyes of the user, of the first light-emitting element, and convert the optical signal into an electric signal, the electric signal being configured to determine a gaze position of the eyes of the user on the display panel; a first polarizer layer, disposed on a light-emitting side of the first light-emitting element; and a second polarizer layer, disposed on a side, distal from the display panel, of the photoelectric sensor assembly, a polarization direction of the second polarizer layer being intersected with a polarization direction of the first polarizer layer.

20. A non-transitory computer-readable storage medium storing one or more instructions, wherein the one or more instructions, when loaded and executed by a wearable display device, causes the wearable display device to perform a method applicable to a wearable display device, the method comprising:
- receiving an optical signal, diffusely reflected via eyes of a user, of a first light-emitting element;
- converting the optical signal into an electric signal; and
- determining the gaze position of the eyes of the user on a display panel based on the electric signal;

and the wearable display device comprises: a display panel, comprising a display region and a peripheral region surrounding the display region; a first light-emitting element, configured to emit light to be irradiated to eyes of a user; a plurality of photoelectric sensor assemblies in the peripheral region, each of the photoelectric sensor assemblies being configured to receive an optical signal, reflected via the eyes of the user, of the first light-emitting element, and convert the optical signal into an electric signal, the electric signal being configured to determine a gaze position of the eyes of the user on the display panel; a first polarizer layer, disposed on a light-emitting side of the first light-emitting element; and a second polarizer layer, disposed on a side, distal from the display panel, of the photoelectric sensor assembly, a polarization direction of the second polarizer layer being intersected with a polarization direction of the first polarizer layer.

\* \* \* \* \*